United States Patent
Ginetti et al.

(10) Patent No.: US 7,971,175 B2
(45) Date of Patent: Jun. 28, 2011

(54) METHOD AND SYSTEM FOR IMPLEMENTING CACHED PARAMETERIZED CELLS

(75) Inventors: Arnold Ginetti, Antibes (FR); Gilles S. C. Lamant, Sunnyvale, CA (US); Randy Bishop, Pleasanton, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 311 days.

(21) Appl. No.: 11/769,568

(22) Filed: Jun. 27, 2007

(65) Prior Publication Data

US 2009/0007031 A1 Jan. 1, 2009

(51) Int. Cl.
*G06F 11/22* (2006.01)
*G06F 17/50* (2006.01)
*G06F 13/00* (2006.01)
*G06F 15/167* (2006.01)

(52) U.S. Cl. .................. 716/136; 711/113; 709/213
(58) Field of Classification Search .............. 716/4, 136; 709/213; 711/113
See application file for complete search history.

(56) References Cited

U.S. PATENT DOCUMENTS

| | | | |
|---|---|---|---|
| 5,511,197 A * | 4/1996 | Hill et al. ....................... | 719/328 |
| 5,802,349 A * | 9/1998 | Rigg et al. ..................... | 716/103 |
| 5,841,663 A * | 11/1998 | Sharma et al. .................. | 716/18 |
| 6,735,742 B2 | 5/2004 | Hatsch et al. | |
| 6,857,110 B1 * | 2/2005 | Rupp et al. ......................... | 716/4 |
| 7,089,512 B2 * | 8/2006 | Iadanza et al. ................ | 716/102 |
| 7,293,247 B1 | 11/2007 | Newton et al. | |
| 7,379,952 B2 | 5/2008 | Chan et al. | |
| 7,398,503 B2 * | 7/2008 | Teig et al. ........................ | 716/18 |
| 7,543,251 B2 * | 6/2009 | Teig et al. .......................... | 716/2 |
| 7,698,662 B1 * | 4/2010 | Wu et al. ............................ | 716/1 |
| 2003/0002320 A1 | 1/2003 | Arakawa | |
| 2003/0121019 A1 | 6/2003 | Brown et al. | |
| 2003/0229860 A1 * | 12/2003 | Li ..................................... | 716/1 |
| 2006/0002320 A1 | 1/2006 | Costa-Requena et al. | |
| 2006/0095882 A1 * | 5/2006 | Mankin et al. .................. | 716/11 |
| 2006/0101368 A1 * | 5/2006 | Kesarwani et al. ............. | 716/11 |
| 2006/0253809 A1 * | 11/2006 | Karniewicz ....................... | 716/1 |
| 2006/0253827 A1 * | 11/2006 | Karniewicz ..................... | 716/17 |
| 2008/0133788 A1 | 6/2008 | Inoue | |
| 2008/0237789 A1 * | 10/2008 | He et al. ........................ | 257/531 |

OTHER PUBLICATIONS

Gangwar, Sandeep et al., "Virtuoso Express Pcells for better Interoperability and Performance on OA", from CDN Live, India, 2007. pp 1-16. Obtained at http://www.cadence.com/rl/Resources/conference_papers/4.5_presentationIndia.pdf on Aug. 26, 2009.*
Non-Final Office Action dated Aug. 10, 2010 for U.S. Appl. No. 12/028,546.
Notice of Allowance dated Jan. 7, 2011 for U.S. Appl. No. 12/028,546.

* cited by examiner

*Primary Examiner* — Stacy A Whitmore
(74) *Attorney, Agent, or Firm* — Vista IP Law Group, LLP

(57) ABSTRACT

Parameterized cells are cached and provided by the plug-in to increase the speed and efficiency of an application for circuit design. This allows source design to be read-interoperable and also enables some basic write-interoperability in the source design.

32 Claims, 5 Drawing Sheets

METHOD AND SYSTEM FOR IMPLEMENTING CACHED PARAMETERIZED CELLS

FIELD

The invention relates to Integrated Circuit (chip) design, and in particular, to a system and method for implementing cached parameterized cells.

BACKGROUND

Parameterized cells (pcells) have been used for more than twenty years in designing full custom chip designs. The pcells are evaluated every time the design is opened. The highly dynamic nature of pcells introduces a level of variability that the design teams may want to control.

Over the years, the use of pcells has shown three main drawbacks. The first drawback is long design opening time. Designs containing pcells are often slow to open as the code within the pcells are evaluated in order to produce the pcell design data. The second drawback is the lack of read-interoperability of the pcells. When the pcell code is written in some proprietary language such as SKILL, third party application not linking the right pcell evaluator can not evaluate the pcells, and can thus not have access to the pcell design data. The third drawback is the lack of write-interoperability of the pcells. Third party applications have difficulty correctly editing a design containing non-evaluated pcells.

Several solutions have been proposed to partially address some of these drawbacks. The first solution is to translate the design into a fully evaluated, tool neutral representation, for example GDSII. The second solution is to create a complete copy of the design. Within that copy, remaster all instances of pcell into instances of a regular cell (e.g., the regular cell being a copy of the pcell instance sub-master). This process is also known as "freezing" the design. A variant of that solution replaces the sub-masters in place with a saved version of the pcell parameters, to enable later "thawing" of the design. A third solution is provided by CiraNova of Santa Clara, Calif. It provides a low performance cache from external observation of the behavior of the third party application in that environment. For example, in the Virtuoso environment, it replaces all SKILL pcell instances as CiraNova pcell instances. The CiraNova pcell plug-in role is to cache on disk evaluated pcell and to re-use those from disk. The evaluation is done by invoking a sub-process, e.g., a DFII subprocess, to evaluate one pcell sub-master at a time, to store it on disk as a regular master in a temporary lib/cell/view, then to copy the layout file within a cache. The re-use is done by populating the cached regular master to a temporary lib/cell/view, to open that lib/cell/view and to copy the design data from that lib/cell/view to pcell sub-master created by a system such as OpenAccess (available from www.si2.org) when evaluating a pcell with a new set of parameters.

However, none of these solutions fully or adequately solves the aforementioned problems. Therefore, there is a need for an improved approach for implementing pcells.

SUMMARY

According to some embodiments, the present invention is directed to caching pcell sub-master contents, after being evaluated within the native application. These sub-masters are persistently saved on disk in a cache. To limit the number of disk inputs and outputs (IOs), all sub-masters of the same pcell are stored in the same binary file cache.

When the pcell evaluator is called to generate a new pcell variant, the cache is first consulted. If the data is already available in the cache, then the sub-master is populated directly with the cached data. Otherwise, the regular sub-master evaluation process takes place, and the sub-master elements are generated to populate the variant. In one embodiment, the application is an electronic design automation (EDA) application, such as the Virtuoso application available from Cadence Design Systems of San Jose, Calif. In another embodiment, a Virtuoso pcell evaluator is called to generate new pcell variant.

In some embodiments, control to regenerate the cached data to the application covers different situations. For example, the pcell master has changed due to new source code. The referenced technology database has changed, which triggers different evaluation result. The application, such as Virtuoso, controls this regeneration, based upon user preferences. "Refresh" is set on a per-super-master basis, to allow selective freezing of pcell masters in a design.

In third party applications, a reduced pcell evaluator, implemented as a Virtuoso pcell Plug-In, is able to re-use the cache in the same way. But this reduced pcell evaluator is not able to evaluate a pcell sub-master. In one embodiment, the pcell evaluator is a reduced Virtuoso pcell evaluator. For example, if the cache does not exist or if the cache does not contain a copy of the corresponding sub-master contents, the Virtuoso Reduced Pcell Evaluator (plug-in) can not evaluate the pcell and thus can not fill the sub-master. It thus leaves the sub-master empty.

By combining selective re-evaluation of pcell sub-masters, and intelligent caching techniques, this present invention dramatically speeds up the start-up time of a design containing a lot of small pcells, or some huge pcells, because it evaluates those pcells only once.

DETAILED DESCRIPTION

Figure 1:
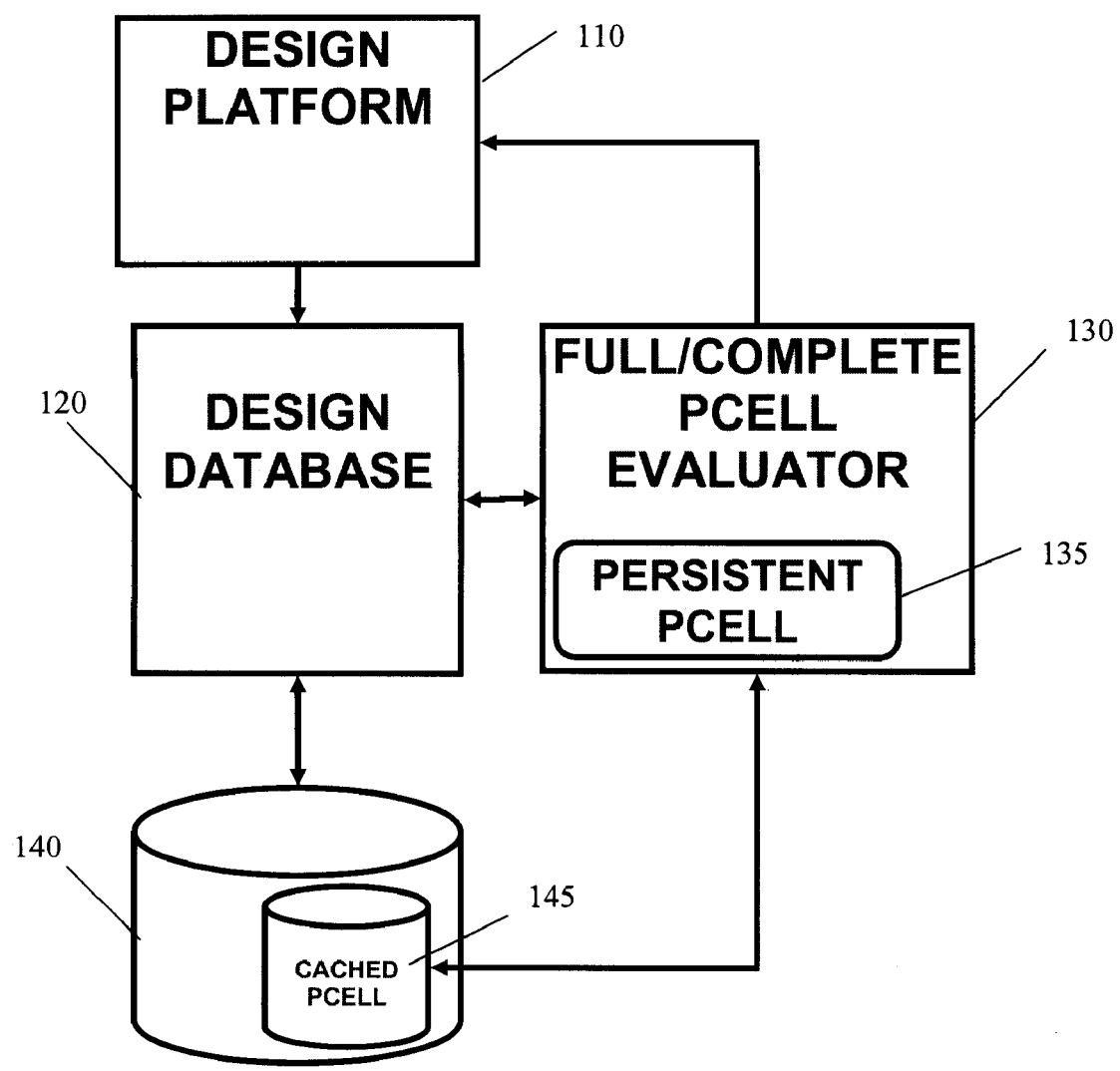
FIG. 1 illustrates a block diagram having a complete Virtuoso pcell evaluator.

The present invention has many advantages over the prior solutions. Once the cache is filled, the next design opening will be very fast. Moreover, the source design is read-interoperable from a third party application. In addition, the present invention also enables write-interoperability as the third party application is exposed to the source design. Furthermore, it can add error markers, routes, parasitics with third party applications.

In one embodiment, a pcell evaluator includes a portion of software code, e.g., C++ code, responsible for filling a pcell sub-master with respect to a given set of parameters. The parameters are specified by the user when creating an instance of a pcell. The pcell evaluator is called to fill the sub-master of that instance by evaluating the code of the pcell (e.g., SKILL code in the case of Virtuoso) against the instance parameters.

A Pcell evaluator may be implemented in a plurality of different ways. For example, as a statically linked compiled library, the pcell evaluator is compiled into a library statically linked to the application using it. In one embodiment, the application of the design platform is a Virtuoso application. In another example, as a dynamic linked compiled library, the pcell evaluator is compiled into a library dynamically linked to the application using it. In another embodiment, the application is a third party application.

In another embodiment, the EDA application, e.g., Virtuoso, uses a statically linked pcell evaluator. In some embodiments, that Evaluator is not based on any cache. When a design is opened, pcell instances are re-evaluated by executing the SKILL code against the instance parameters. Also, as the Virtuoso pcell evaluator may be available as a statically linked library, only Virtuoso in some embodiments could use it. (i.e., it is not possible for any third party application to dynamically load the pcell evaluator at run time as it was not available as dynamic library).

In a further embodiment, to speed up the design opening time, the statically linked pcell evaluator saves evaluated sub-masters within a cache and retrieves them from the cache in the future. If the sub-master is not in the cache, the statically linked pcell evaluator still has the capability to produce the pcell sub-masters by evaluating the SKILL code against the instance parameters. This functionality enables third party application to receive sub-masters from the cache but does not allow the third party application to evaluate new pcell by evaluating SKILL against instance parameters. This security measure is performed by dynamically linking the evaluator. In an embodiment, a link to a design platform is dynamically created to link the pcell evaluator, or pcell plug-in. When it is implemented as a plug-in, third party application may load it dynamically. In a further embodiment, the pcell evaluator is dynamically linked as a piece of the Virtuoso statically linked pcell evaluator. To ensure the security of the pcell designs, third party applications are only able to use the reduced dynamically linked pcell evaluator.

FIG. 1 illustrates a block diagram having a complete pcell evaluator, e.g., complete Virtuoso pcell evaluator. The complete pcell evaluator supports cached pcell sub-master contents. In one embodiment, this is implemented as a module within the pcell plug-in. This module is responsible for filling the cache and accessing the cache, based on the user settings, and evaluating sets of parameters passed in by the application.

In another embodiment, the cache itself is implemented as a set of binary files stored on disk within the library structure or in a different location. Each binary file may be used for a pcell master, also known as a pcell cache file. Thus, the content of the many sub-masters of one pcell master is stored within one unique pcell cache file. There is also be a binary index file listing the evaluated pcells stored in the pcell binary file together with the parameter values used to evaluate those and some index/offset to find out the pcell data from the cached pcell file. This second file is known as the pcell index file. Storing all sub-masters of a given pcell within one file may greatly reduce the disk IOs necessary when accessing the cache. All the files (e.g., cached pcell file and its index) are stored in a location related to the cell in which the different instances of the PCell are located. In embodiments including 5.X library, it could be the cellview directory itself.

In one embodiment, the design database requests to evaluate a pcell instance for a given parameter set in order to fill a sub-master produced by the design database. If the user settings are such that it is required, the complete pcell evaluator may first access the pcell index file to find out whether the same pcell has been evaluated and persistently saved in the past. If it has, it gets the index and amount of data to be read in the pcell cache file. This information together with the pcell cache file pointer is passed to a new design function, which reads that amount of data to directly fill the pcell sub-master. In the case the complete pcell evaluator does not find the right sub-master from the pcell index file or is forced by the user set-up to re-evaluate the pcell, it may get the pcell code evaluated by the evaluator of the design platform.

FIG. 1 includes a design platform 110, a design database 120, a complete pcell evaluator-in 130 and storage 140. The complete pcell evaluator in 130 includes persistent pcells 135. The storage includes a cache for storing pcells 145.

The design platform 110 analyzes and evaluates a chip design having pcells. In some embodiments, it may request additional design information from a design database 120 in order to properly and efficiently analyze and evaluate a chip design. In one embodiment, a request for information regarding the design of the pcell is sent to the design database 120. In another embodiment, the platform may directly obtain the information in the database.

The design database 120 includes information that may assist the analysis and simulation of the chip design. In an embodiment, the design database is an OpenAccess database. Any database may be used depending on the application. The database 120 may require information that is remotely located. In one embodiment, the design database retrieves design information that is in storage 140. Information relating to the pcell may be sent to a different location. In one embodiment, the design database 120 requiring pcell design information provides the request and/or design to the complete pcell evaluator.

The complete pcell evaluator 130 determines if the pcell parameter information is located within the persistent pcell cache (on disk storage). The persistent pcells allows the pcell design information to be provided to the platform with little delay. If not, then the pcell design may need to be evaluated and then, later, at user request, stored as persistent pcells. Other pcells information may be available in the cache 145. The pcells information is retrieved and stored as persistent pcells and provided to the platform. If the pcell is already in the cache or is persistent pcell 135, then the information is provided to the design platform without being analyzed by the evaluator.

Figure 2:
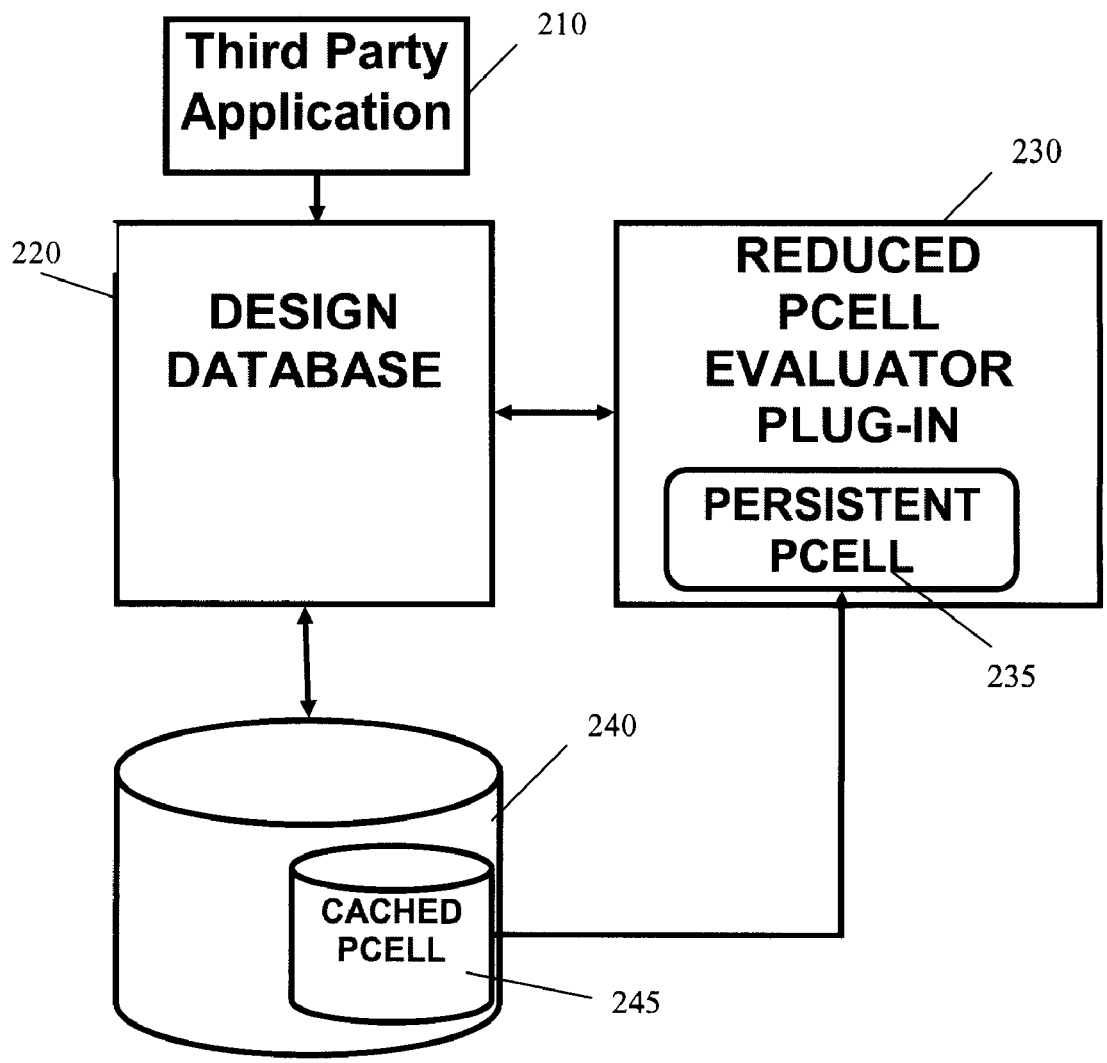
FIG. 2 illustrates a block diagram where a reduced Virtuoso pcell evaluator implemented as a plug-in is usable by a third party application.

FIG. 2 illustrates a block diagram where the cached pcell is usable from a third party application. The cached pcell is accessible by the third party application linking to the pcell Plug-in. In one embodiment, the third party application is unable to evaluate a pcell as the evaluator is not available to be called from the plug-in (e.g., no changing or creating of new sub-masters). In another embodiment, third party applications re-use pcells previously cached by an EDA design platform such as Virtuoso.

FIG. 2 includes a third party application 210, a design database 220, a pcell plug-in 230 and storage 240. The storage includes a portion for storing cached pcells 245, and the pcell plug-in includes persistent pcell 235.

The third party application 210 runs processes in a proprietary language. It communicates with the design database 220 for analyzing and evaluating chip design. In one embodiment, the design database 220 may be in a publicly available format such as OpenAccess. In another embodiment, the design database 220 is also in the proprietary language which allows communication between the application and database. When the third party application 210 requires pcell information from the design database 220, it communicates with the pcell plug-in 230. The pcell plug-in checks for the pcell information in storage and attempt to retrieve the cached pcell 245 from the storage 240. If found, the information is provided to the pcell plug-in 230, which in turn is provided to the application. If it is not a persistent pcell and not in the storage, then the application will not have access to pcell sub-master design data. For design information not related to the pcell, the design database 220 may communicated directly with the application and storage 240. Note that in some embodiments, the pcell plug-in is always reduced.

Figure 3:
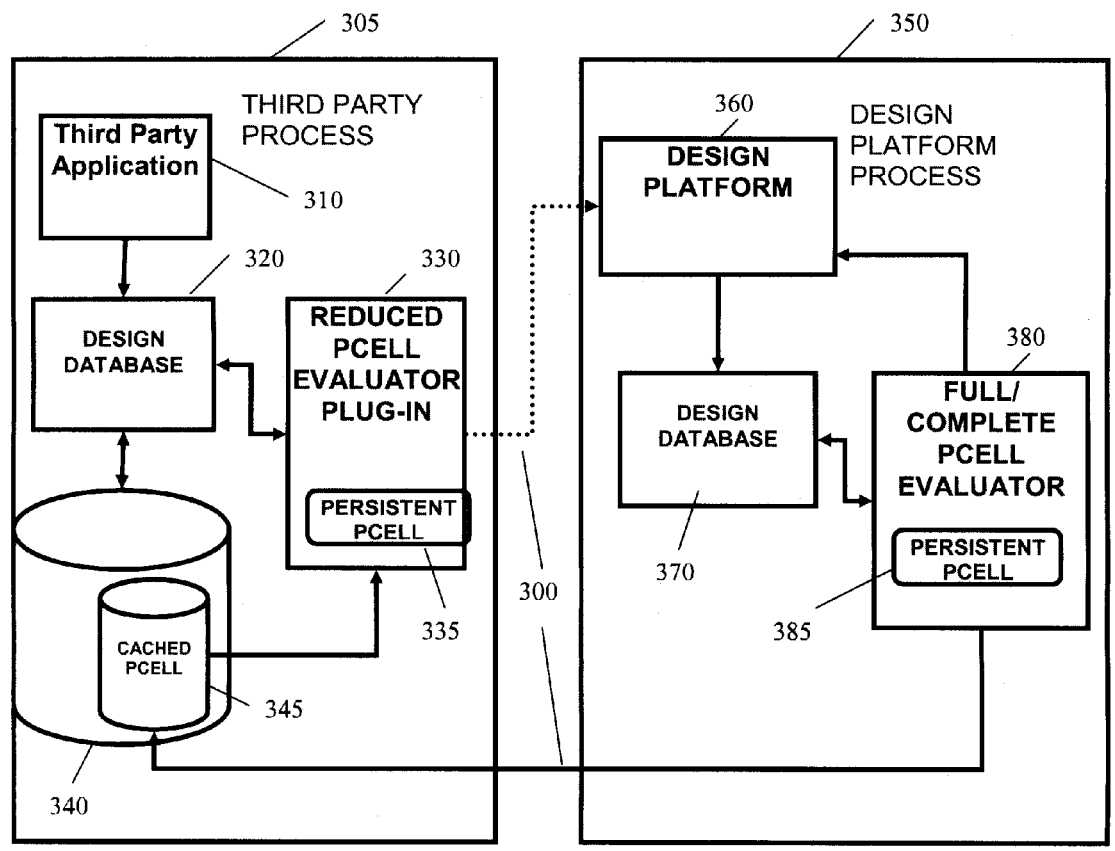
FIG. 3 illustrates a block diagram of a write interoperable solution with a third party process.

FIG. 3 illustrates a block diagram of a write interoperable solution with a third party process, which presents an alternative embodiment of the invention. In this case, in addition to the plug-in, a licensed version of the evaluator may be provided as a callable process. This would enable a fully write interoperable solution, while still allowing the owner to license this capability (i.e., it can edit and create new pcell sub-masters).

FIG. 3 includes third party process 305 and a design platform process 350. The third party process 305 having a third party application 310, a third party design database 320, pcell plug-in 330, which may includes persistent cell 335 and storage 340. The design platform process 350 has the design platform 360, a second design database 320, and a pcell plugin 380, which may include persistent cell 385.

In one embodiment, the third party process 305 functions substantially similar to FIG. 2 and the third party design platform process 350 functions substantially similar to FIG. 1. The two processes are coupled via a communication link. The pcell plug-in of the third party application 310 may be communicatively coupled to the design platform 360 via connection 300 to enable writing interoperability.

In another embodiment, the third party application 310 analyzes a chip design and requests information from the design database 320. The third party design database 320 is coupled to the pcell plug-in. If the information requested is a pcell, then it checks the pcell plug-in 330. If the pcell is cached 345 as persistent pcell 335, then the information is provided to the third party design database 320 and/or the third party application for the application 310. The design database may be in a publicly accepted format such as OpenAccess or in any format required by the third party application.

If the pcell design requires evaluation, then the pcell information is communicated to the design platform 360 via connection 300. The design plateform 360 is coupled to the second design database 370 and pcell plug-in 380. The evaluator 385 of the pcell plugin 380 evaluates the pcell design using its second design database 370 and its pcell plug-in 380 similar to the embodiment of FIG. 1 to generate the persistent pcell 385. The persistent pcell 385 is then stored in storage 340 as cached pcell 345 for pcell plug-in 330. Therefore, the third party application 310 is able to retrieve persistent pcell information without requiring knowledge of the pcell parameters and designs.

Figure 4:
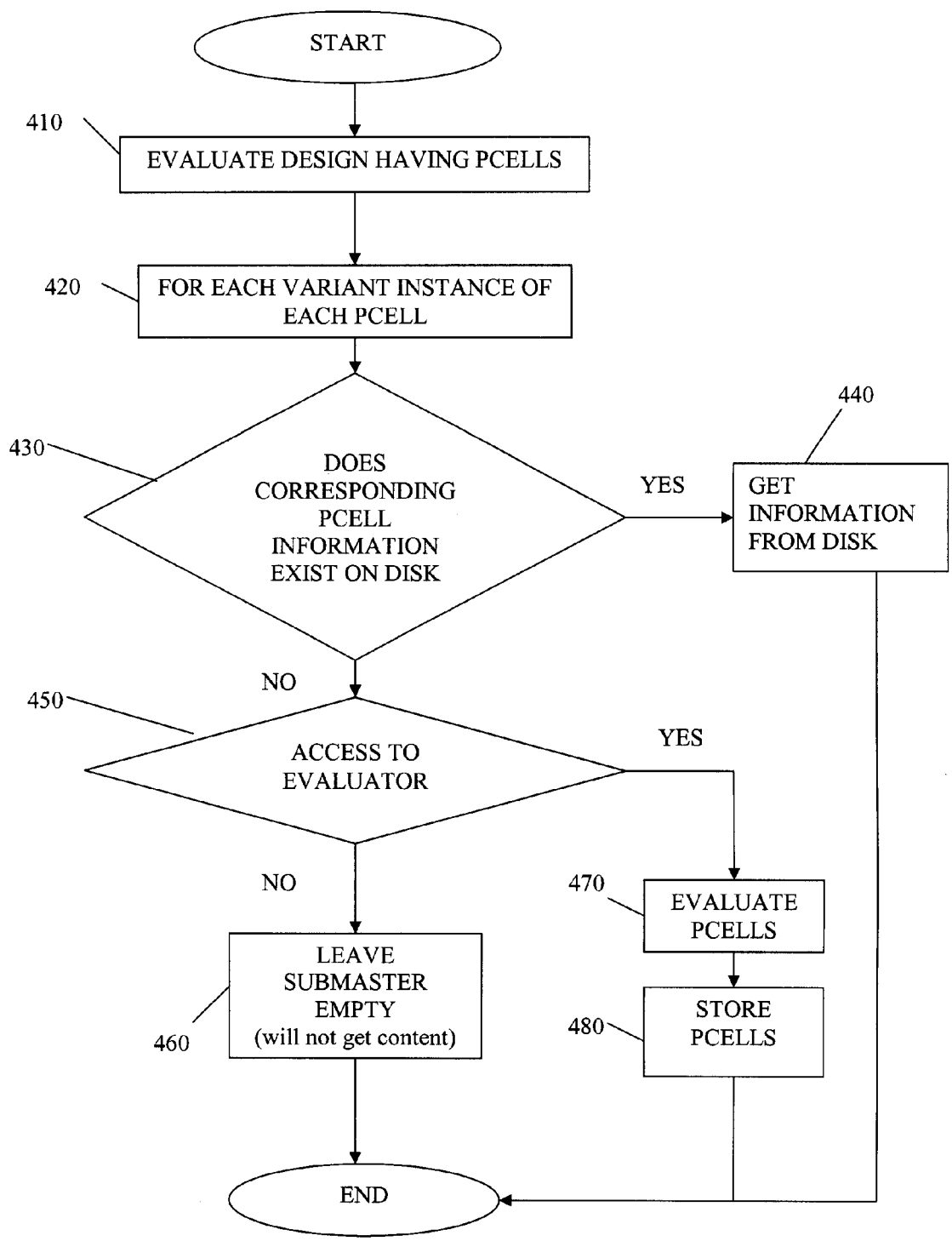
FIG. 4 depicts a flow diagram of a method for caching pcells.

FIG. 4 describes a flow of a method for caching pcells. At 410, a circuit design is evaluated. The design maybe in a publicly available language or proprietary language and may be the same or different than the language of the pcell plug-in. In one embodiment, the design platform is Virtuoso using OpenAccess. In another embodiment, the design is an application using a proprietary language. Any circuit design in any application may be used.

In order to analyze the design, a design database is called. In one embodiment, the design database is a format such as OpenAccess. In another embodiment, the design database is in a proprietary language. Any design database may be used as long as it is able to communicate with the application with the circuit design. In a further embodiment, the design database communicates with other components such as pcell plug-in, storage and memory in order to obtain the necessary information for the designs.

At 420, For each variant instance of each pcell, the process determines if the application can obtain the pcell parameters from the plug-in or if the pcell design has to be evaluated. At 430, the design database determines if a part of the design information requested is pcell information on disk. The design database communicated with the pcell plug-in for assistance. If the pcell information is already stored as persistent pcell. If it is, then it is retrieved at 440.

At 450, after determining the pcell is not in storage, the pcell plug-in determines if it has access to any evaluators. If no evaluators are available, then the submaster is left empty 460 and the process ends. If an evaluator is available, then the pcell is analyzed and stored as persistent pcell. At 470, the evaluation analyzes the design of the pcell. In one embodiment, this evaluation is performed by a different design platform process. In another embodiment, the evaluation may be performed by the same process. Any evaluator may be used for this evaluation process. At 480, the evaluated pcell is stored for future use by the design database and pcell plug-in. The process may be repeated for the next pcell instance after this process ends.

Figure 5:
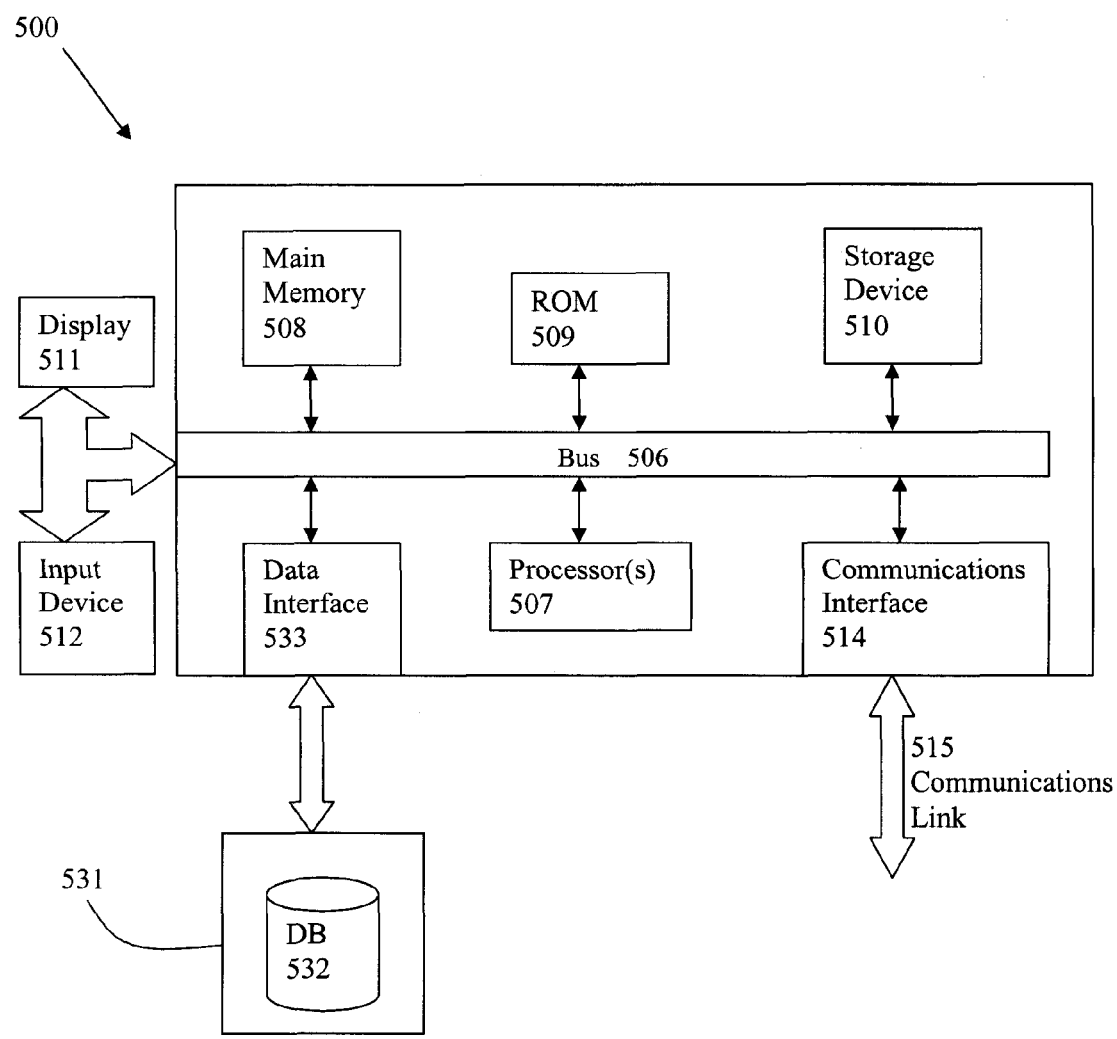
FIG. 5 depicts a computerized system on which a method for caching pcells can be implemented.

FIG. 5 depicts a computerized system on which a method for caching pcells can be implemented. The execution of the sequences of instructions required to practice the embodiments may be performed by a computer system 500 as shown in FIG. 5. In an embodiment, execution of the sequences of instructions is performed by a single computer system 500. According to other embodiments, two or more computer systems 500 coupled by a communication link 515 may perform the sequence of instructions in coordination with one another. Although a description of only one computer system 500 will be presented below, however, it should be understood that any number of computer systems 500 may be employed to practice the embodiments.

A computer system 500 according to an embodiment will now be described with reference to FIG. 5, which is a block diagram of the functional components of a computer system 500. As used herein, the term computer system 500 is broadly used to describe any computing device that can store and independently run one or more programs.

Each computer system 500 may include a communication interface 514 coupled to the bus 506. The communication interface 514 provides two-way communication between computer systems 500. The communication interface 514 of a respective computer system 500 transmits and receives electrical, electromagnetic or optical signals, which include data streams representing various types of signal information, e.g., instructions, messages and data. A communication link 515 links one computer system 500 with another computer system 500. For example, the communication link 515 may be a LAN, in which case the communication interface 514 may be a LAN card, or the communication link 515 may be a PSTN, in which case the communication interface 514 may be an integrated services digital network (ISDN) card or a modem, or the communication link 515 may be the Internet, in which case the communication interface 514 may be a dial-up, cable or wireless modem.

A computer system 500 may transmit and receive messages, data, and instructions, including program, i.e., application, code, through its respective communication link 515 and communication interface 514. Received program code may be executed by the respective processor(s) 507 as it is received, and/or stored in the storage device 510, or other associated non-volatile media, for later execution.

In an embodiment, the computer system 500 operates in conjunction with a data storage system 531, e.g., a data storage system 531 that contain a database 532 that is readily accessible by the computer system 500. The computer system 500 communicates with the data storage system 531 through a data interface 533. A data interface 533, which is coupled to the bus 506, transmits and receives electrical, electromagnetic or optical signals, which include data streams representing various types of signal information, e.g., instructions, messages and data. In embodiments, the functions of the data interface 533 may be performed by the communication interface 514.

Computer system 500 includes a bus 506 or other communication mechanism for communicating instructions, messages and data, collectively, information, and one or more processors 507 coupled with the bus 506 for processing information. Computer system 500 also includes a main memory 508, such as a random access memory (RAM) or other dynamic storage device, coupled to the bus 506 for storing dynamic data and instructions to be executed by the processor(s) 507. The main memory 508 also may be used for storing temporary data, i.e., variables, or other intermediate information during execution of instructions by the processor(s) 507.

The computer system 500 may further include a read only memory (ROM) 509 or other static storage device coupled to the bus 506 for storing static data and instructions for the processor(s) 507. A storage device 510, such as a magnetic disk or optical disk, may also be provided and coupled to the bus 506 for storing data and instructions for the processor(s) 507.

A computer system 500 may be coupled via the bus 506 to a display device 511, such as, but not limited to, a cathode ray tube (CRT), for displaying information to a user. An input device 512, e.g., alphanumeric and other keys, is coupled to the bus 506 for communicating information and command selections to the processor(s) 507.

According to one embodiment, an individual computer system 500 performs specific operations by their respective processor(s) 507 executing one or more sequences of one or more instructions contained in the main memory 508. Such instructions may be read into the main memory 508 from another computer-usable medium, such as the ROM 509 or the storage device 510. Execution of the sequences of instructions contained in the main memory 508 causes the processor(s) 507 to perform the processes described herein. In alternative embodiments, hard-wired circuitry may be used in place of or in combination with software instructions. Thus, embodiments are not limited to any specific combination of hardware circuitry and/or software.

The term "computer-usable medium," as used herein, refers to any medium that provides information or is usable by the processor(s) 507. Such a medium may take many forms, including, but not limited to, non-volatile and/or volatile media. Non-volatile media, i.e., media that can retain information in the absence of power, includes the ROM 509, CD ROM, magnetic tape, and magnetic discs. Volatile media, i.e., media that can not retain information in the absence of power, includes the main memory 508.

In the foregoing specification, the embodiments have been described with reference to specific elements thereof. It will, however, be evident that various modifications and changes may be made thereto without departing from the broader spirit and scope of the embodiments. For example, the reader is to understand that the specific ordering and combination of process actions shown in the process flow diagrams described herein is merely illustrative, and that using different or additional process actions, or a different combination or ordering of process actions can be used to enact the embodiments. The specification and drawings are, accordingly, to be regarded in an illustrative rather than in a restrictive sense.

What is claimed is:

1. A computer implemented method for providing parameterized cells to a third party application, comprising:
    using a computer system which comprises at least one processor and is programmed for:
    determining whether a persistent parameterized cell includes desired parameterized cell information;
    storing the desired parameterized cell information of a parameterized cell in a file if the parameterized cell is persistently stored as the persistent parameterized cell, wherein the desired information of a plurality of sub-masters of the parameterized cell is stored in the file;
    evaluating the parameterized cell if the persistent parameterized cell is not available for retrieval;
    providing the parameterized cell that is evaluated to the third party application, wherein the third party application is not allowed to evaluate the parameterized cell if the persistent parameterized cell is not available for retrieval; and
    persistently storing the parameterized cell that is evaluated in a computer readable storage medium or a computer storage device for future retrieval.

2. The method of claim 1, wherein files of the same parameterized cells are stored in the same binary file cache.

3. The method of claim 1, wherein the remote design platform is coupled to a parameterized cell evaluator.

4. The method of claim 3, wherein a reduced parameterized cell plug-in is communicatively coupled to the third party application and the parameterized cell evaluator.

5. The method of claim 1 wherein the design platform comprises Virtuoso.

6. A computer implemented method for providing parameterized cells to a third party application, comprising:
    using a computer system which comprises at least one processor and is programmed for:
    determining whether a persistent parameterized cell includes desired parameterized cell information; and
    providing a parameterized cell to a third party application; and
    persistently storing the desired parameterized cell information of a parameterized cell in a file if the parameterized cell is stored as the persistent parameterized cell in a computer readable storage medium or a computer storage device, wherein
        the desired information of a plurality of sub-masters of the parameterized cell is stored in the file, and
        the third party application includes read access of the persistent parameterized cell and does not include write access.

7. The method of claim 6, wherein files of the same parameterized cells are stored in the same binary file cache.

8. The method of claim 6, wherein the third party application is coupled to a parameterized cell plug-in, which is unable to evaluate a parameterized cell.

9. The method of claim 6, further comprising invoking a complete evaluator to populate a file and store for future retrieval.

10. The method of claim 9, wherein the evaluator includes a Virtuoso evaluator or any tool containing Virtuoso's evaluator.

11. A computer implemented method for providing parameterized cells to a design platform, comprising:
    using a computer system which comprises at least one processor and is programmed for:

determining whether a parameterized cell is stored as a persistent parameterized cell;

evaluating the parameterized cell if the persistent parameterized cell is not available for retrieval;

providing the parameterized cell that is evaluated to the third party application, wherein the third party application is not allowed to evaluate the parameterized cell if the persistent parameterized cell is not available for retrieval; and persistently storing the parameterized cell that is evaluated for future retrieval in a file in a computer readable storage medium or a computer storage device, wherein the file comprises information of a plurality of sub-masters of the parameterized cell.

12. The method of claim 11, wherein files of the same parameterized cells are stored in the same binary file cache.

13. The method of claim 11, wherein the design platform is coupled to a parameterized cell evaluator.

14. The method of claim 11 wherein the design platform is Virtuoso.

15. An apparatus, comprising:

a computing system that comprises at least one processor and is programmed for performing:

determining whether a parameterized cell is stored as a persistent parameterized cell;

evaluating the parameterized cell if the persistent parameterized cell is not available for retrieval;

providing the parameterized cell that is evaluated to the third party application, wherein the third party application is not allowed to evaluate the parameterized cell if the persistent parameterized cell is not available for retrieval; and persistently storing the parameterized cell that is evaluated for future retrieval in a computer readable storage medium or a storage device configured.

16. The apparatus of claim 15, the computing system is further programmed for performing:

storing the desired information of a plurality of sub-masters of the parameterized cell in a file in a computer readable storage medium or a computer storage device, wherein the computer readable storage medium or the computer storage device comprises the file and one or more other files.

17. The apparatus of claim 15, the computing system is further programmed for performing:

storing a second desired information or data of a plurality of parameterized cells that are evaluated in a second file in a computer readable storage medium or a computer storage device.

18. A computer program product embodied on computer readable storage medium, the computer readable storage medium having stored thereon a sequence of instructions which, when executed by a processor, causes the processor to execute a process for specifying property values of a hierarchical circuit design, the process comprising:

determining whether a parameterized cell is stored as a persistent parameterized cell;

evaluating the parameterized cell if the persistent parameterized cell is not available for retrieval;

providing the parameterized cell that is evaluated to the third party application, wherein the third party application is not allowed to evaluate the parameterized cell if the persistent parameterized cell is not available for retrieval;

persistently storing the parameterized cell that is evaluated in a file in a computer readable storage medium or a computer storage device for future retrieval, wherein the file comprises information of a plurality of sub-masters of the parameterized cell.

19. A computer program product of claim 18, the process further comprising:

storing a second desired information of a plurality of sub-masters of the parameterized cell in a file in a computer readable storage medium or a computer storage device, wherein the computer readable storage medium or the computer storage device comprises the file and one or more other files.

20. A computer program product of claim 18, the process further comprising:

storing a second desired information or data of a plurality of parameterized cells that are evaluated in a second file in a computer readable storage medium or a computer storage device.

21. An apparatus, comprising:

a computing system which comprises at least one processor and is programmed for performing:

determining whether a persistent parameterized cell includes desired parameterized cell information;

providing a parameterized cell to a third party application; and persistently storing the desired parameterized cell information of a parameterized cell in a file if the parameterized cell is stored as the persistent parameterized cell, wherein the desired information of a plurality of sub-masters of the parameterized cell is stored in the file, and the third party application includes read access of the persistent parameterized cell and does not include write access.

22. The apparatus of claim 21, the computing system is further programmed for performing:

storing a second desired information of a plurality of sub-masters of the parameterized cell in a file in a computer readable storage medium or a computer storage device, wherein the computer readable storage medium or the computer storage device comprises the file and one or more other files.

23. The apparatus of claim 21, the computing system is further programmed for performing:

storing a second desired information or data of a plurality of parameterized cells that are evaluated in a second file in a computer readable storage medium or a computer storage device.

24. A computer program product embodied on computer readable storage medium, the computer readable storage medium having stored thereon a sequence of instructions which, when executed by a processor, causes the processor to execute a process for specifying property values of a hierarchical circuit design, the process comprising:

determining whether a persistent parameterized cell includes desired parameterized cell information; and providing a parameterized cell to a third party application; and persistently storing the desired parameterized cell information of a parameterized cell in a file if the parameterized cell is stored as the persistent parameterized cell in a computer readable storage medium or a computer storage device, wherein the desired information of a plurality of sub-masters of the parameterized cell is stored in the file, and the third party application includes read access of the persistent parameterized cell and does not include write access.

25. The computer program product of claim 24, the process further comprising:
   storing a second desired information of a plurality of sub-masters of the parameterized cell in a file in a computer readable storage medium or a computer storage device, wherein the computer readable storage medium or the computer storage device comprises the file and one or more other files.

26. The computer program product of claim 24, the process further comprising:
   storing a second desired information or data of a plurality of parameterized cells that are evaluated in a second file in a computer readable storage medium or a computer storage device.

27. An apparatus, comprising:
   a computing system which comprises at least one processor and is programmed for performing:
   determining whether a persistent parameterized cell includes desired parameterized cell information;
   storing the desired parameterized cell information of a parameterized cell in a file if the parameterized cell is stored as the persistent parameterized cell, wherein the desired information of a plurality of sub-masters of the parameterized cell is stored in the file;
   evaluating the parameterized cell if the persistent parameterized cell is not available for retrieval;
   providing the parameterized cell that is evaluated to the third party application, wherein the third party application is not allowed to evaluate the parameterized cell if the persistent parameterized cell is not available for retrieval; and
   persistently storing the evaluated parameterized cell that is evaluated in a computer readable storage medium or a computer storage device for future retrieval.

28. The apparatus of claim 27, the computing system is further programmed for performing:
   storing a second desired information of a plurality of sub-masters of the parameterized cell in a file in a computer readable storage medium or a computer storage device, wherein the computer readable storage medium or the computer storage device comprises the file and one or more other files.

29. The apparatus of claim 27, the computing system is further programmed for performing:
   storing a second desired information or data of a plurality of parameterized cells that are evaluated in a second file in a computer readable storage medium or a computer storage device.

30. A computer program product embodied on computer readable storage medium, the computer readable storage medium having stored thereon a sequence of instructions which, when executed by a processor, causes the processor to execute a process for specifying property values of a hierarchical circuit design, the process comprising:
   determining whether a persistent parameterized cell includes desired parameterized cell information;
   storing the desired parameterized cell information of a parameterized cell in a file if the parameterized cell is stored as the persistent parameterized cell, wherein the desired information of a plurality of sub-masters of the parameterized cell is stored in the file;
   evaluating the parameterized cell if the persistent parameterized cell is not available for retrieval;
   providing the parameterized cell that is evaluated to the third party application, wherein the third party application is not allowed to evaluate the parameterized cell if the persistent parameterized cell is not available for retrieval; and
   storing the parameterized cell that is evaluated in a computer readable storage medium or a computer storage device for future retrieval.

31. The computer program product of claim 30, the process further comprising:
   storing a second desired information of a plurality of sub-masters of the parameterized cell in a file in a computer readable storage medium or a computer storage device, wherein the computer readable storage medium or the computer storage device comprises the file and one or more other files.

32. The computer program product of claim 30, the process further comprising:
   storing a second desired information or data of a plurality of parameterized cells that are evaluated in a second file in a computer readable storage medium or a computer storage device.

* * * * *